(12) United States Patent
Kim et al.

(10) Patent No.: US 6,434,040 B1
(45) Date of Patent: Aug. 13, 2002

(54) LOADLESS NMOS FOUR TRANSISTOR SRAM CELL

(75) Inventors: Tae Hyoung Kim, Pleasanton; Subramani Kengeri, San Jose, both of CA (US)

(73) Assignee: Silicon Access Networks, San Jose, CA (US)

(*) Notice: Subject to any disclaimer, the term of this patent is extended or adjusted under 35 U.S.C. 154(b) by 0 days.

(21) Appl. No.: 09/793,872

(22) Filed: Feb. 23, 2001

(51) Int. Cl.[7] .............................................. G11C 11/00
(52) U.S. Cl. .................. 365/154; 365/156; 365/189.09; 365/185.24
(58) Field of Search ...................... 365/189.01, 230.01, 365/154, 156, 189.09, 185.24, 185.01

(56) References Cited

U.S. PATENT DOCUMENTS

| | | | | |
|---|---|---|---|---|
| 5,070,482 A | * | 12/1991 | Miyagi ................... | 365/230.06 |
| 5,936,892 A | * | 8/1999 | Wendell ................. | 365/189.03 |
| 5,986,924 A | * | 11/1999 | Yamada ................... | 365/154 |
| 6,172,899 B1 | * | 1/2000 | Marr et al. ................. | 365/154 |
| 6,044,011 A | * | 3/2000 | Marr et al. ................. | 365/154 |
| 6,297,624 B1 | * | 10/2000 | Mitsui et al. ................ | 323/316 |
| 6,301,146 B1 | * | 10/2001 | Ang et al. ................... | 365/154 |
| 2001/0000308 A1 | * | 4/2001 | Marr ........................ | 365/226 |
| 2002/0024863 A1 | * | 2/2002 | Forbes ...................... | 365/203 |

* cited by examiner

Primary Examiner—Viet Q. Nguyen
(74) Attorney, Agent, or Firm—Fernandez & Associates, LLP (57) ABSTRACT

A static random access memory cell utilizes four NMOS transistors and does not require load elements. The semiconductor memory cell device maintains a stable data hold by utilizing a sub-threshold voltage to charge the word line, the sub-threshold voltage being higher than the low voltage reference of the memory cell device and lower than the threshold voltage of the NMOS access transistors. The sub-threshold voltage is biased to the word line during non-active and non-charging operations of the memory cell.

The loadless four-transistor NMOS SRAM memory cell of the present invention requires a significantly smaller silicon area than prior art loadless four-transistor CMOS SRAM memory cells.

3 Claims, 7 Drawing Sheets

LOADLESS NMOS FOUR TRANSISTOR SRAM CELL

BACKGROUND OF INVENTION

1. Field of Invention

Invention relates to static random access memory (SRAM) and more particularly to negative channel metal oxide semiconductor (NMOS) SRAM memory cell.

2. Related Art

There is a continuing need for higher density memory cells that can be fabricated in a given semiconductor die area. SRAM memory cells differ from other types of memory devices because there is no need for refreshing the data stored in the device. The demand for higher memory continues; thus, there is a need for memory cell designs that requires less silicon area yet meet the requirements of power, data stability, and speed of input and output operations of current applications.

SUMMARY OF INVENTION

The present invention resides in loadless four-transistor memory cell architecture. The memory cell device comprise a word: line for receiving an activation signal, a first and a second access transistor for processing the activation signal from the word line, a first and a second drive transistor for storing a bit value, the first access transistor cross-coupled to the second drive transistor and the second access transistor cross-couple to the first drive transistor; and complimentary bit lines for transmitting the bit value during input or output operations. The first and second access transistors and the first and second drive transistors are NMOS transistors.

The semiconductor memory cell device maintains a stable data hold by utilizing a sub-threshold voltage to charge the word line, the sub-threshold voltage being higher than the low voltage reference of the memory cell device and lower than the threshold voltage of the NMOS transistors, the application of the sub-threshold voltage to the word line occurs during non-active and non-charging operations of the memory cell device. The memory cell does not require any load elements. The precharge time of sub-threshold voltage biased word line is longer than the active time during input/output operations.

The loadless four-transistor NMOS SRAM memory cell of the present invention requires a significantly smaller silicon area than prior art four-transistor CMOS SRAM memory cells.

DETAILED DESCRIPTION OF PREFERRED EMBODIMENT(S)

Figure 1:
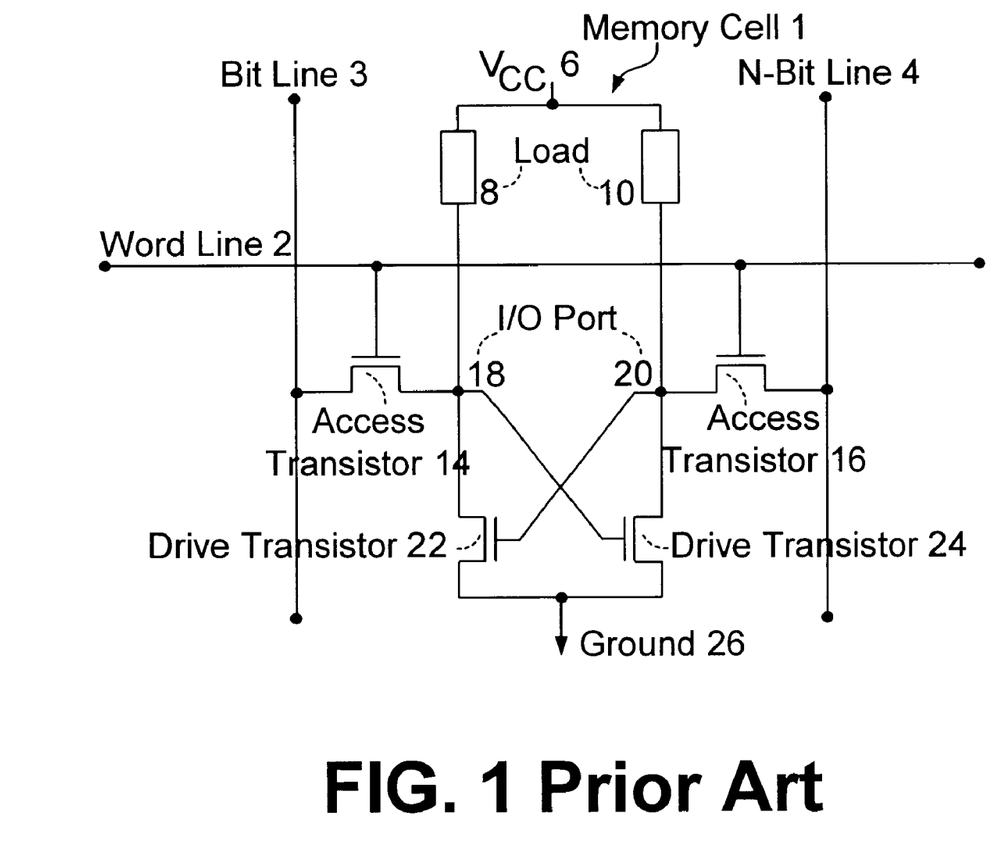
FIG. 1 is a schematic diagram illustrating prior art variations of SRAM memory cells.

FIG. 1 is a schematic diagram illustrating prior art variations of SRAM memory cells. A basic memory cell 1 includes drive transistors 22 and 24 coupled to I/O ports 18 and 20, the source of drive transistors 22 and 24 cross-coupled to the corresponding drain of access transistors 12 and 16. The source of access transistor 14 is coupled to bit line 3 and the source of access transistor 16 is coupled to N-bit line 4. The gates of access transistors 14 and 16 are coupled to the word line 2. The I/O ports 18 and 20 are correspondingly coupled to loads 8 and 10; loads 8 and 10 are in turn coupled to the high reference voltage $V_{CC}$ 6. The drains of drive transistors 22 and 24 are coupled to ground 26. The loads 8 and 10 comprise resistors, P-channel transistors, and or N-channel transistors. Access transistors 14 and 16 are generally PMOS transistors and the drive transistors are generally NMOS. A typical six-transistor memory cell is where the loads 8 and 10 are pull-up transistors.

Figure 2:
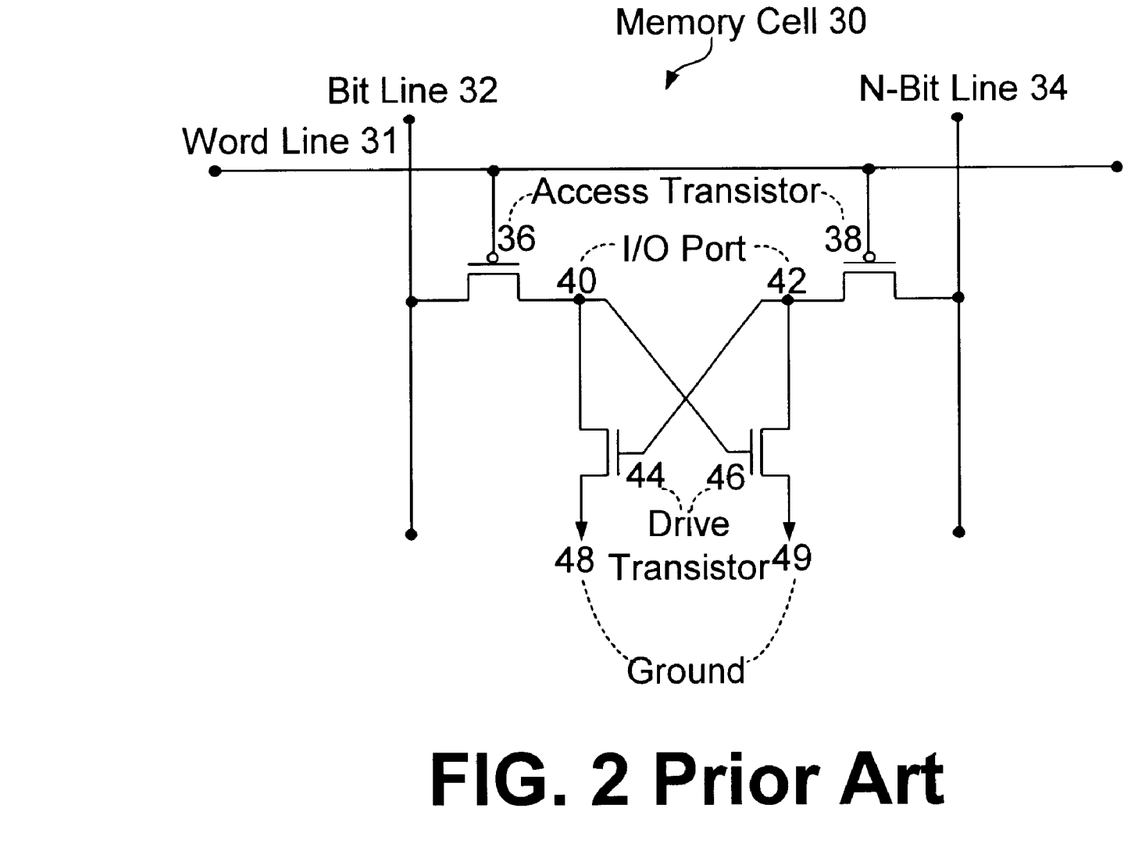
FIG. 2 is a schematic diagram illustrating a prior art loadless four-transistor SRAM memory cell.

FIG. 2 is a schematic diagram illustrating prior art loadless four-transistor SRAM memory cell. Word line 31 is coupled to the gates of the access transistors 36 and 38. A complimentary bit line 32 and N-bit line 34 are coupled to the source of access transistors 14 and 16 respectively. The drain of access transistors 36 and 38 are coupled correspondingly to I/O port 40 and 42 which in turn are cross-coupled to the corresponding gates of drive transistors 44 and 46. The drain of access transistor 36 is coupled to the source of drive transistor 44 and the drain of drive transistor 44 is coupled to ground 48. Similarly, the drain of access transistor 38 is coupled to the source of drive transistor 46 and the drain of drive transistor 46 is coupled to ground 49. Access transistors 35 and 38 are PMOS transistors and drive transistors 44 and 46 are NMOS transistors. The loadless four-transistor SRAM memory cell illustrated in FIG. 2 was described in the article, "A 16 MHz Loadless CMOS Four-Transistor SRAM Macro", by Takeda, et al, 2000 IEEE ISSCC p. 264–265.

Figure 3:
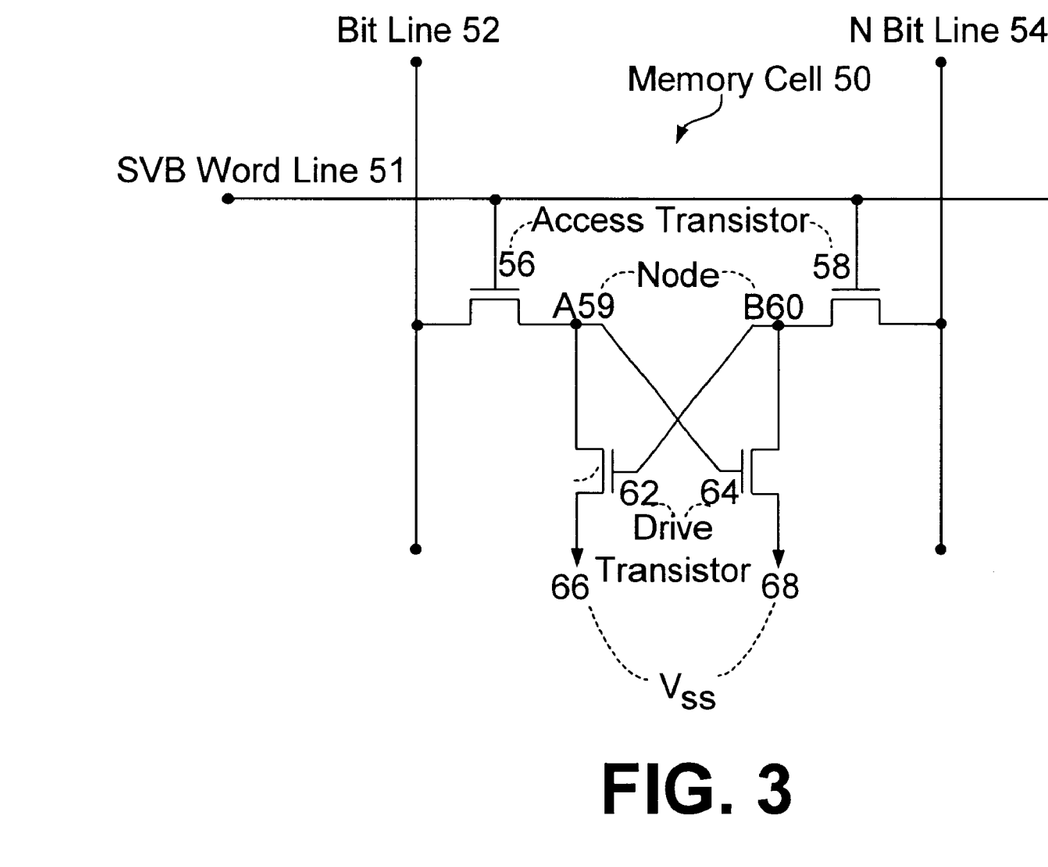
FIG. 3 is a schematic diagram illustrating the loadless four-transistor NMOS SRAM memory cell in one embodiment of the present invention.

FIG. 3 is a schematic diagram illustrating the loadless four-transistor NMOS SRAM memory cell in one embodiment of the present invention. The memory cell 50 utilizes two NMOS access transistors 56 and 58 and two NMOS drive transistors 62 and 64. The sub-threshold voltage biased (SVB) word line 51 is coupled to the gates of access transistors 56 and 58. The source of access transistor 56 is coupled to bit line 52 whereas the source of access transistor 58 is coupled to N-bit line 54. Node A 59 is an I/O port coupled to the drain of access transistor 56, cross-coupled to the gate of drive transistor 64, and coupled to the source of drive transistor 62. Similarly, Node B 60 is an I/O port coupled to the drain of access transistor 58, cross-coupled to the gate of drive transistor 62, and coupled to the source of drive transistor 64. The drains of both drive transistors 66 and 68 are coupled to the low reference voltage $V_{SS}$.

Referring to FIG. 3, a write of a logic 0 involves charging the Bit Line 52 low, N-bit line 54 high, and SVB word line 51 high. The SVB word line 51 being high activates access transistors 56 and 58. With access transistor 56 conducting, the bit line 52 low charge passes from source to drain of access transistor 56 and charges Node A 59 low, leaving drive transistor 64 non-conducting and causing the current to dissipate through the $V_{SS}$ 68. With access transistor 58 conducting, the N-bit line 54 high charge passes from source to drain of access transistor 58 and charges Node B 60 high, activating drive transistor 62 with a high charge. After the write operation, the SVB word line 51 is charged with a sub-threshold voltage ($V_{SS}+\Delta V$), the logic 0 stored in the latched drive transistors 62 and 64 is retained. $\Delta V$ is a voltage that is higher than the low reference voltage $V_{SS}$ and less than the threshold voltage of the NMOS access transistors.

Referring still to FIG. 3, a write of a logic 1 involves charging the bit line 52 high, N-bit line 54 low, and SVB word line 51 high. The SVB word line 51 being high activates access transistors 56 and 58. With access transistor 56 conducting, the bit line 52 high charge passes from source to drain of access transistor 56 and charges Node A 59 high, leaving drive transistor 64 with a high charge. With access transistor 58 conducting, the N-bit line 54 low charge passes from source to drain of access transistor 58 and charges Node B 58 low, activating drive transistor 62 with a low charge, causing the current to dissipate through the $V_{SS}$. After the write operation, the SVB word line 51 is charged with a sub-threshold voltage ($V_{SS}+\Delta V$), the logic 1 stored in the latched drive transistors 62 and 64 is retained.

Reading the logic value of the stored data in FIG. 3 is driven by sensing devices (not shown) utilizing bit line 52 and N-bit line 54 or another set of sense lines (not shown) coupled to Node A 59 and Node B 60.

Figure 4:
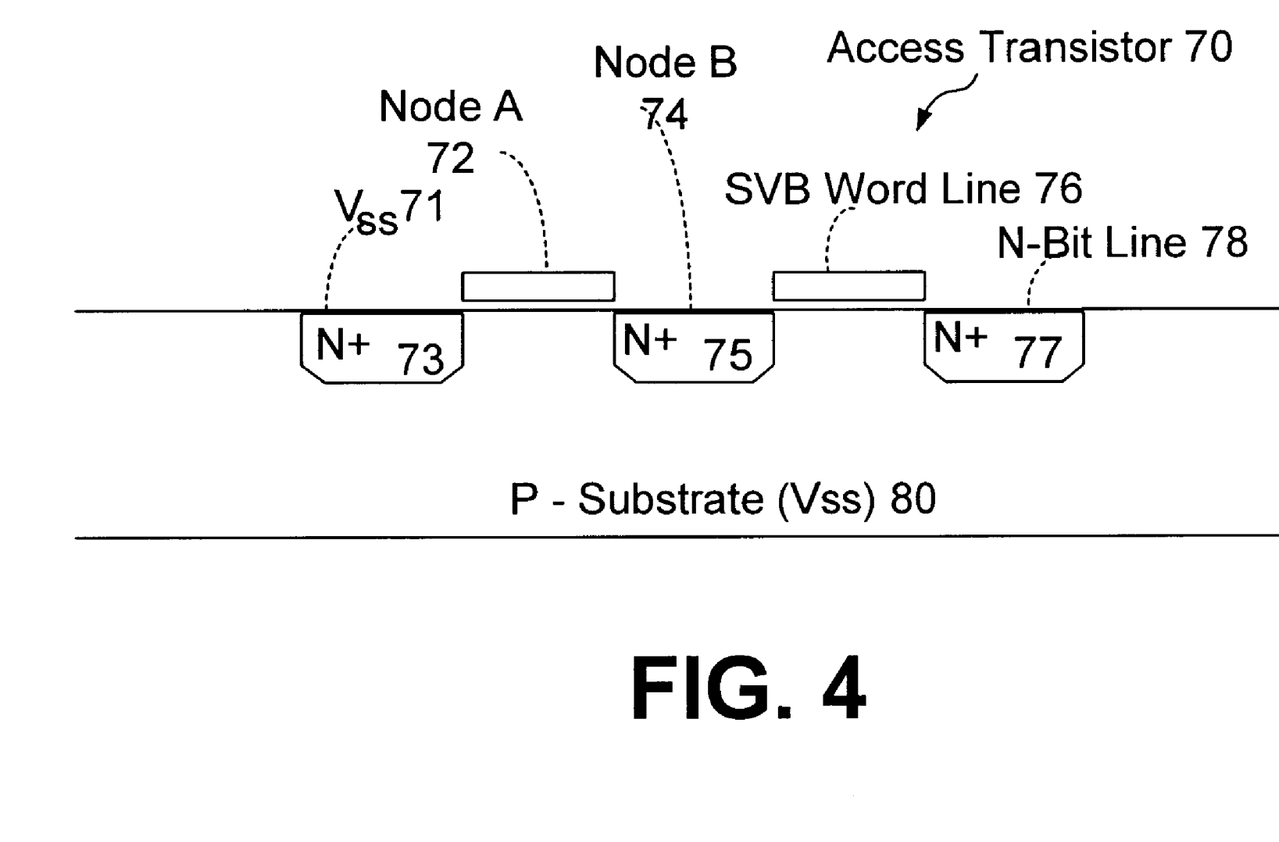
FIG. 4 is a cross-sectional view of a section of the loadless four-transistor NMOS SRAM memory cell in one embodiment of the present invention.

FIG. 4 is a cross-sectional view of a section of the loadless four-transistor NMOS SRAM memory cell in one embodiment of the present invention. Access transistor 70 consists of the gate coupled to the SVB word line 76 with the N+source 77 disposed in an N-well 79 coupled to N-bit line 78. The N+drain 75 of access transistor 70 is disposed in the N-well 79 and coupled to Node B 74. The N-well 79 is disposed in P-substrate 80 biased to $V_{SS}$. In the same N-well 79, N+contact region 73 is coupled to low reference voltage $V_{SS}$ 71. Adjacent to the N+region 75 coupled to Node B 74 is the other node of the memory cell, Node B 74 above the silicon surface. Another N+region 73 in N-well is coupled to the low reference voltage $V_{SS}$.

Figure 5:
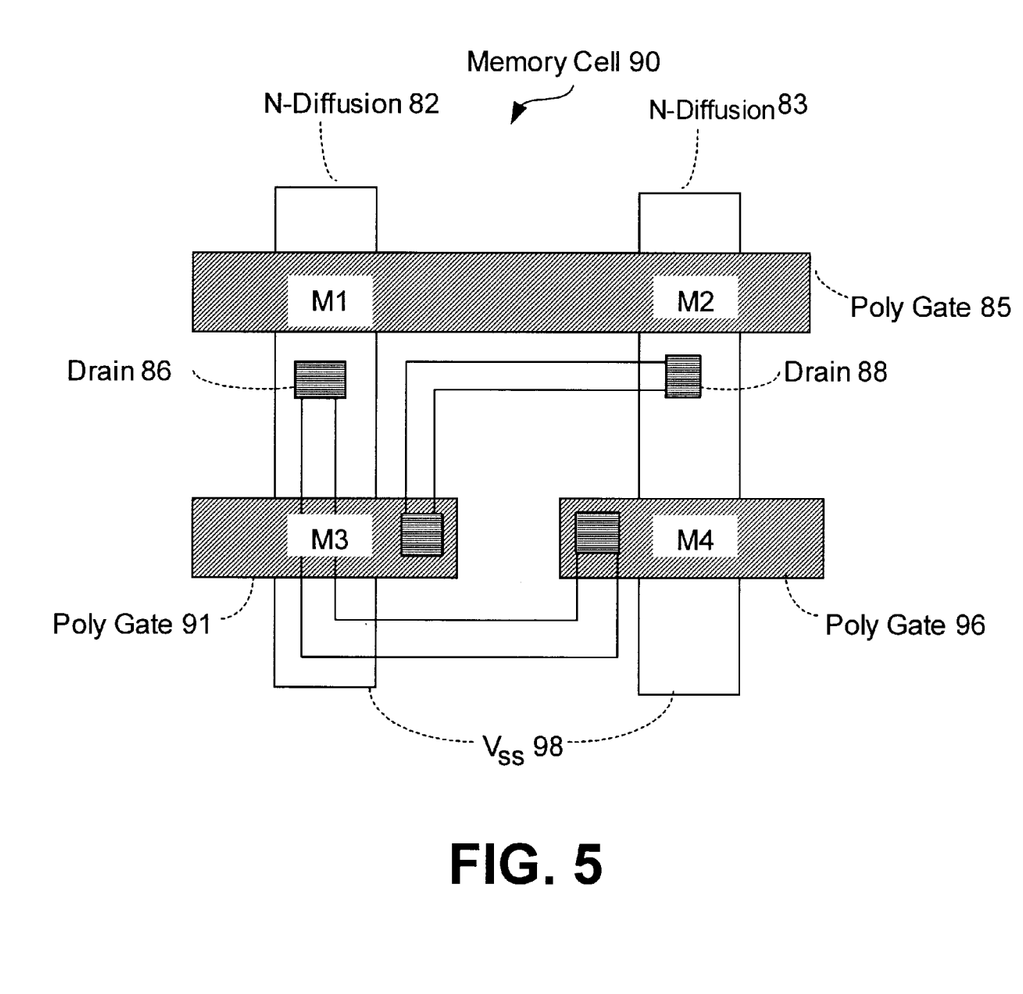
FIG. 5 is a top-view diagram of the loadless four-transistor NMOS SRAM memory cell in one embodiment of the present invention.

FIG. 5 is a top-view diagram of the loadless four-transistor NMOS SRAM memory cell in one embodiment of the present invention. Memory cell 90 comprises N-diffusion 82, N-diffusion 83, polysilicon (poly) gate 85, poly gate 91, and poly gate 96. Poly gate 85 is the gate of access transistors M1 and M2. Drive transistor M3 is cross-coupled to the drain 88 of access transistor M2. Drive transistor M4 is cross-coupled to the drain 86 of access transistor M1. N-diffusion 82 and N-diffusion 83 are biased at the low reference voltage $V_{SS}$ 98.

Figure 6:
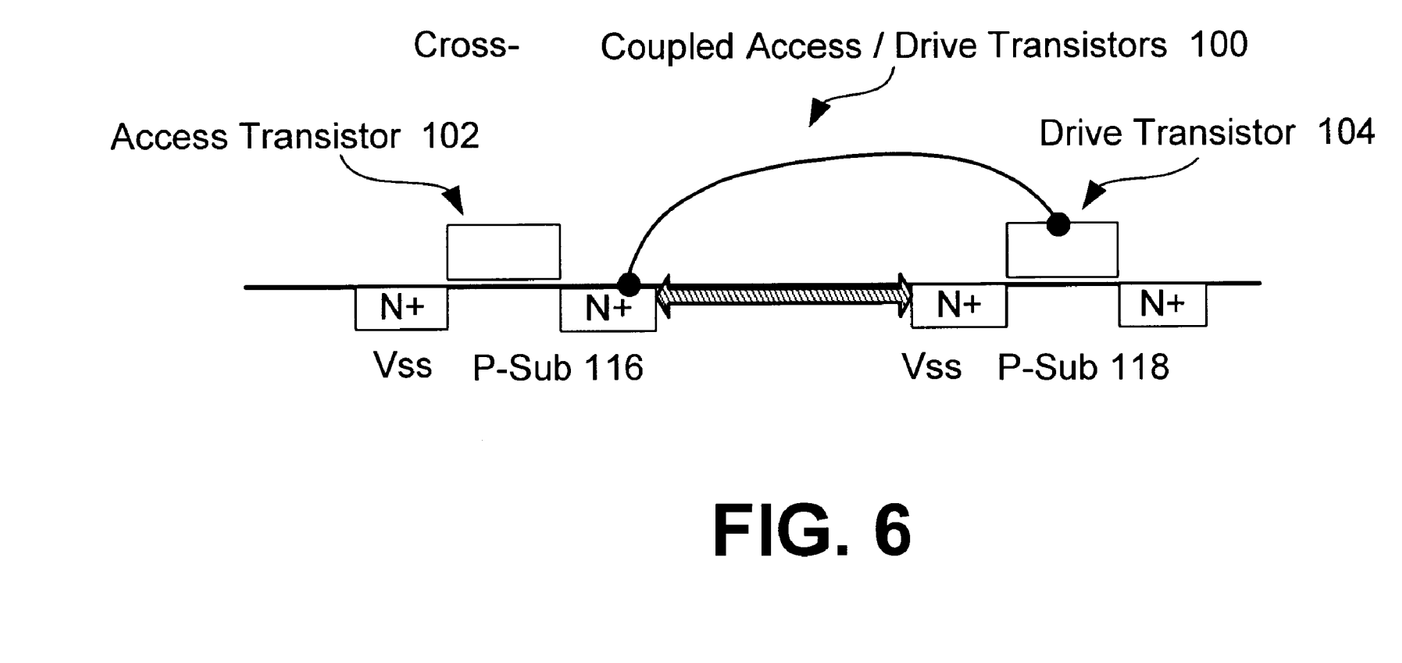
FIG. 6 is a cross-sectional view showing a cross-coupled access and drive transistor in one embodiment of the present invention.

FIG. 6 is a cross-sectional view showing a cross-coupled access and drive transistor in one embodiment of the present invention. Cross-coupled access and drive transistors 100 consist of access transistor 102 with a N+drain cross-coupled to the gate of drive transistor 104. The N+drain of access transistor 102 is also coupled to the N+source of drive transistor 104. The source and drain of access transistor 102 is disposed in an P-Sub 116 biased at $V_{SS}$. The source and drain of drive transistor 104 is disposed in an P-Sub 118 and biased at $V_{SS}$.

Figure 7:
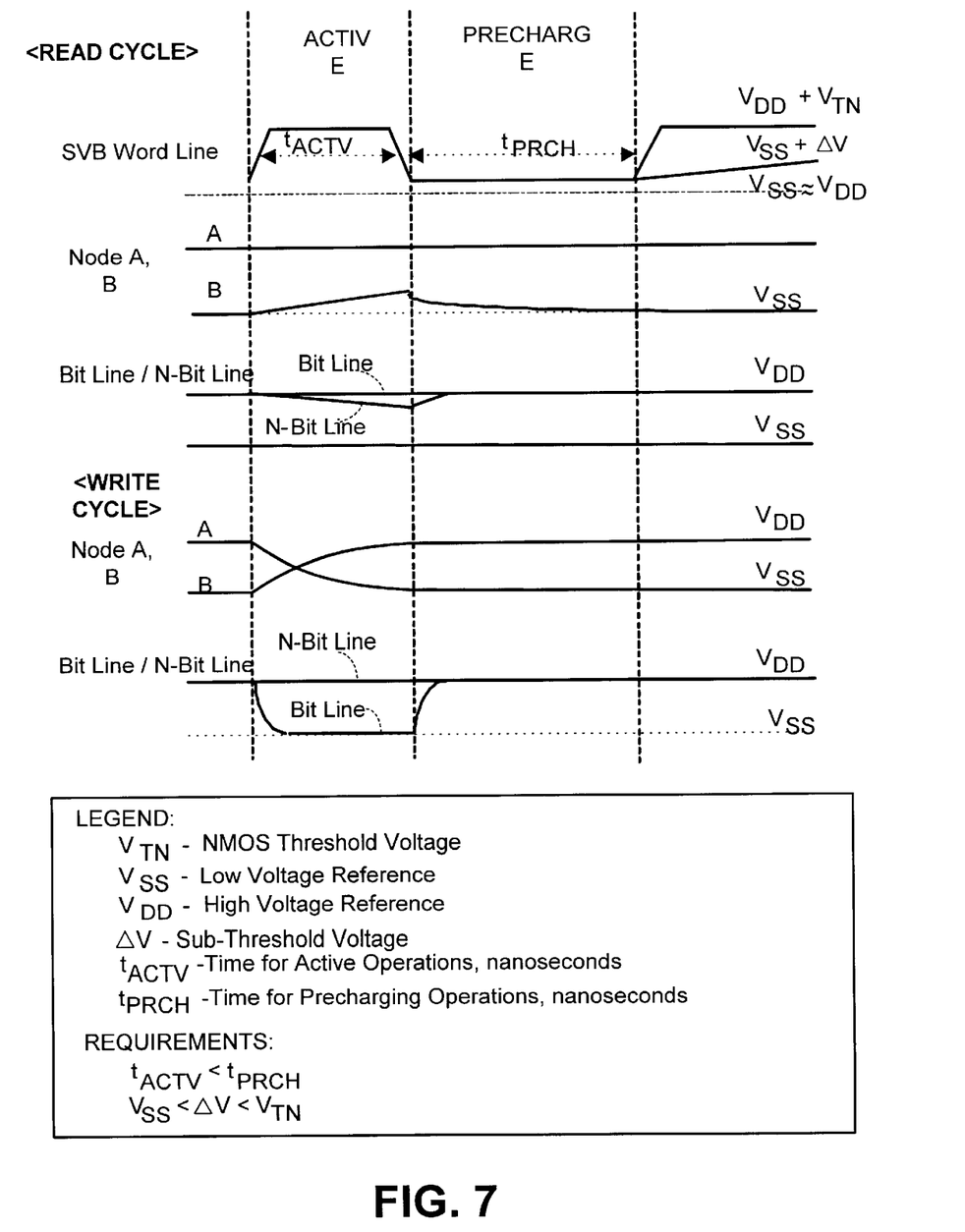
FIG. 7 is a signal waveform diagram schematically illustrating the operation of the loadless four-transistor NMOS SRAM memory cell in one embodiment of the present invention.

FIG. 7 is a signal waveform diagram schematically illustrating the operation of the loadless four-transistor NMOS SRAM memory cell in one embodiment of the present invention. In the read cycle, the potential of the SVB word line is charged to the logic high voltage plus the NMOS transistor threshold voltage, ($V_{DD}+V_{TN}$), and kept at this level during the active duration of the read operation, $t_{ACTV}$. During the period of precharging as measured by $t_{PRCH}$, the potential of the SVB word line is maintained at a value of ($V_{SS}+\Delta V$) to enable stable retention of data latched in the drive transistors. Node A 59 of FIG. 3 remains at potential approximately equal to $V_{DD}$. Node B 58 of FIG. 3 rises slightly during the active phase of the read operation and goes down to $V_{SS}$ during the precharge phase of the read operation. The bit line 52 of FIG. 3 remains at $V_{DD}$ whereas the N-bit line 54 potential dips slightly below $V_{DD}$ and returns to $V_{DD}$ a short time after the end of the active phase of the read operation.

Still referring to FIG. 7, during a write operation, the waveform for SVB word line is similar to the read operation. During a write of a logic 0, Node A 58 of FIG. 3 is charged high at $V_{DD}$ and dips to $V_{SS}$ after the write operation. Conversely, Node B 58 of FIG. 3 is charged low at $V_{SS}$ and goes up to $V_{DD}$ after the write operation. N-bit line 54 of FIG. 3 remains at $V_{DD}$ while bit line 52 goes down to $V_{SS}$ and goes up rapidly to $V_{DD}$ after the active phase of the write operation. A write of logic 1 proceeds with Node A charged low, Node B charge high, bit line remaining at $V_{DD}$ while the N-bit line dipping to $V_{SS}$ and returning to $V_{DD}$ after the active phase of the write operation.

The relationship $\Delta V$, $V_{SS}$, and $V_{TN}$ is expressed in the following formula:

$$V_{SS} < \Delta V < V_{TN}$$

Furthermore, the active time for memory cell operation in nanoseconds, $t_{ACTV}$, is less than the precharge time for the memory cell operation in nanoseconds, $t_{PRCH}$.

There are several advantages to the present invention. The use of a voltage $\Delta V$ to maintain a stable bit value latched in the drive transistors of the memory enables use of the smaller NMOS transistors for all four transistors instead of the complementary NMOS and PMOS set. The present invention also eliminates the need for a load consisting of a resistor or a pull-up transistor. As is apparent in FIG. 5, the loadless four-transistor NMOS SRAM memory cell requires a significantly smaller silicon area than prior art four-transistor CMOS SRAM memory cells. The cross-sectional layout of the memory cell in one embodiment of the present invention as illustrated in FIG. 4 enables efficient use of chip area, thus allowing higher memory densities for a given silicon area. Although a particular layout is illustrated in the figures, one having ordinary skills in the art would know the other variations of design and implementation for a loadless four-transistor NMOS SRAM memory cell utilizing the principles and concepts of the present invention.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks.

Other variations and embodiments are possible in light of above teachings, and it is thus intended that the scope of invention not be limited by this Detailed Description, but rather by claims following.

What is claimed is:

1. A semiconductor memory cell device comprising:
   a word line for receiving an activation signal;
   a first access transistor and a second access transistor for processing the activation signal from the word line;

a first drive transistor and a second drive transistor for storing a bit value, the first access transistor cross-coupled to the second drive transistor and the second access transistor cross-couple to the first drive transistor; and a bit line and a complimentary N-bit line for transmitting the bit value during input or output operations;

where the first access transistor, the second access transistor, the first drive transistor, and the second drive transistor being NMOS transistors, the semiconductor memory cell device maintains a stable data hold by utilizing a sub-threshold voltage to charge the word line, the sub-threshold voltage being higher than the low voltage reference of the memory cell device and lower than the threshold voltage of the first access transistor or the second access transistor, the application of the sub-threshold voltage occurring during non-active and non-charging operations of the memory cell device.

2. The semiconductor memory cell device of claim 1, wherein the memory cell does not require any load elements.

3. The semiconductor memory cell device of claim 1, wherein the sub-threshold voltage biased word line require a shorter active time compared to the precharge time.

* * * * *